(12) United States Patent
Kudaev et al.

(10) Patent No.: US 11,201,141 B2
(45) Date of Patent: Dec. 14, 2021

(54) LIGHT EMITTING DEVICE

(71) Applicant: OSRAM Opto Semiconductors GmbH, Regensburg (DE)

(72) Inventors: Sergey Kudaev, Regensburg (DE); Krister Bergenek, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/317,536

(22) PCT Filed: Sep. 19, 2017

(86) PCT No.: PCT/EP2017/073647
§ 371 (c)(1),
(2) Date: Jan. 12, 2019

(87) PCT Pub. No.: WO2018/050921
PCT Pub. Date: Mar. 22, 2018

(65) Prior Publication Data
US 2019/0295993 A1    Sep. 26, 2019

(30) Foreign Application Priority Data
Sep. 19, 2016   (DE) .......................... 102016117594.3

(51) Int. Cl.
*H01L 25/075* (2006.01)
*H01L 33/46* (2010.01)
(Continued)

(52) U.S. Cl.
CPC .......... *H01L 25/0753* (2013.01); *F21K 9/232* (2016.08); *H01L 33/46* (2013.01);
(Continued)

(58) Field of Classification Search
None
See application file for complete search history.

(56) References Cited

U.S. PATENT DOCUMENTS 9,627,594 B2    4/2017   Maki
9,966,509 B2    5/2018   Ishimori et al.
(Continued)

FOREIGN PATENT DOCUMENTS

CN    101840969 A    9/2010
DE    102010026343 A1    3/2012
(Continued)

*Primary Examiner* — Steven B Gauthier
(74) *Attorney, Agent, or Firm* — Slater Matsil, LLP

(57) ABSTRACT

A light emitting device is disclosed. In an embodiment a light-emitting device includes a plurality of light-emitting diode chips arranged on a mounting surface of a carrier, a first translucent element and a second translucent element, wherein the first translucent element is arranged over the plurality of light-emitting diode chips as viewed from the mounting surface and the second translucent element is disposed on a side of the plurality of light-emitting diode chips opposite the first translucent element such that the light-emitting diode chips are arranged between the first and second translucent elements, wherein the first and second translucent elements are configured to emit light generated by the light-emitting diode chips during operation outwardly, and wherein the first and second translucent elements appear white or grey in daylight.

19 Claims, 2 Drawing Sheets

(51) Int. Cl.
*H01L 33/48* (2010.01)
*H01L 33/50* (2010.01)
*H01L 33/56* (2010.01)
*H01L 33/62* (2010.01)
*F21K 9/232* (2016.01)
*H01L 33/58* (2010.01)
*H01L 33/32* (2010.01)
*H01L 33/36* (2010.01)

(52) U.S. Cl.
CPC .......... *H01L 33/486* (2013.01); *H01L 33/504* (2013.01); *H01L 33/505* (2013.01); *H01L 33/56* (2013.01); *H01L 33/58* (2013.01); *H01L 33/62* (2013.01); *H01L 33/32* (2013.01); *H01L 33/36* (2013.01); *H01L 2224/48091* (2013.01); *H01L 2224/48137* (2013.01); *H01L 2224/73265* (2013.01); *H01L 2933/0091* (2013.01)

(56) References Cited

U.S. PATENT DOCUMENTS

| | | | |
|---|---|---|---|
| 2007/0139949 A1* | 6/2007 | Tanda | F21V 13/14 362/551 |
| 2010/0295464 A1* | 11/2010 | Kasakura | H01L 25/0753 315/287 |
| 2011/0006316 A1* | 1/2011 | Ing | G02F 1/133606 257/89 |
| 2011/0233565 A1* | 9/2011 | Bierhuizen | H01L 25/0753 257/84 |
| 2012/0235181 A1* | 9/2012 | Matsuda | H01L 33/507 257/88 |
| 2013/0207144 A1 | 8/2013 | Ramchen et al. | |
| 2013/0249381 A1* | 9/2013 | Takeuchi | H05B 33/02 313/292 |
| 2014/0273892 A1* | 9/2014 | Nourbakhsh | H04W 88/08 455/90.3 |
| 2015/0137165 A1 | 5/2015 | Tagami et al. | |
| 2017/0278829 A1 | 9/2017 | Stoll et al. | |

FOREIGN PATENT DOCUMENTS

| | | |
|---|---|---|
| DE | 102014117017 A1 | 5/2015 |
| DE | 102014112681 A1 | 3/2016 |
| DE | 102015113640 A1 | 3/2016 |
| EP | 2636940 A1 | 9/2013 |
| EP | 2669946 A2 | 12/2013 |
| JP | 2015073103 A | 4/2015 |

* cited by examiner

LIGHT EMITTING DEVICE

This patent application is a national phase filing under section 371 of PCT/EP2017/073647, filed Sep. 19, 2017, which claims the priority of German patent application 102016117594.3, filed Sep. 19, 2016, each of which is incorporated herein by reference in its entirety.

TECHNICAL FIELD

A light emitting device is specified.

BACKGROUND

So-called retrofits are increasingly being used as a replacement for conventional lighting elements such as incandescent lamps, which, in regard to their design, are as similar as possible to that of conventional lighting elements, but which use light-emitting diodes as light sources. In order to produce white light, blue emitting light-emitting diodes with yellow or orange fluorescent materials can typically be used and, for example, can be used in an elongated arrangement as a so-called filament instead of a glow wire. When switched off, however, the filament usually appears yellowish or orange due to the fluorescent material, which may be undesirable for aesthetic reasons.

SUMMARY OF THE INVENTION

Embodiments provide a light-emitting device with a plurality of light emitting diode chips.

According to at least one embodiment, a light-emitting device has a plurality of light-emitting diode chips. The light-emitting diode chips can have a semiconductor layer sequence with an active layer for generating light, which is grown on a growth substrate by means of an epitaxial process, for example, by means of metal-organic vapor phase epitaxy (MOVPE) or molecular beam epitaxy (MBE). Depending on the wavelength to be emitted, the light-emitting diode chips can have a semiconductor layer sequence based on different semiconductor material systems. For example, a semiconductor layer sequence based on $In_xGa_yAl_{1-x-y}As$ is suitable for long-wave, infrared to red radiation, a semiconductor layer sequence based on $In_xGa_yAl_{1-x-y}P$ is suitable for red to yellow radiation, and a semiconductor layer sequence based on $In_xGa_yAl_{1-x-y}N$ is suitable for short-wave visible radiation, particularly for green to blue radiation, and/or for UV radiation, wherein $0 \leq x \leq 1$, $0 \leq y \leq 1$ and $x+y \leq 1$ apply respectively.

According to another embodiment, the light-emitting device has a carrier on which the plurality of light-emitting diode chips is arranged. In particular, the carrier may have a mounting surface on which the plurality of light-emitting diode chips is arranged. It is particularly preferred that all light-emitting diode chips of the light-emitting device are arranged on a same side of the carrier. In other words, this can mean that the carrier has a mounting surface on exactly one side for mounting the light-emitting diode chips, while all other sides of the carrier are free of light-emitting diode chips.

According to another embodiment, the carrier is elongated along a longitudinal direction. In other words, this may mean that the carrier is rod-shaped with a main direction of extension in the longitudinal direction and has significantly smaller dimensions in the directions perpendicular thereto. Accordingly, the mounting surface, which may extend along the longitudinal direction and a lateral direction perpendicular thereto, may have a significantly larger dimension along the longitudinal direction than along the lateral direction. Preferably, all light-emitting diode chips of the light-emitting device can be arranged along the longitudinal direction on the mounting surface. In other words, all light-emitting diode chips of the light-emitting device can be arranged along a line extending in a longitudinal direction on the carrier.

According to a further embodiment, the carrier has electrical contact elements for the electrical contacting of the light-emitting diode chips. In particular, the carrier may have an electrical contact element at each of two opposite ends, preferably at each of two opposite ends in the longitudinal direction. In particular, by means of the contact elements all light-emitting diode chips of the light-emitting device can be electrically contacted. In particular, the light-emitting diode chips can form a series circuit which can be electrically contacted by means of the electrical contact elements. In particular, all light-emitting diode chips of the light-emitting device may be part of the series connection. In particular, the two electrical contact elements can be the only electrical contact elements of the light-emitting device by means of which the light-emitting diode chips can be electrically contacted. Furthermore, the electrical contact elements may be intended and embodied for the mechanical assembly of the light-emitting device in an external fixture not belonging to the light-emitting device. The fixture by means of which the light-emitting device can be fixed may in particular be part of a lighting device comprising the light-emitting device as a light-generating element. The fixture can simultaneously form an electrical supply line for the light-emitting device. For example, the lighting device may have a structure similar to that of an incandescent lamp and may look like a classic incandescent bulb in its outer shape, using the light-emitting device instead of a glow wire.

According to another embodiment, the light-emitting device has a first translucent element and a second translucent element. "Translucent" here and in the following means transmissive but not clearly transparent for light. In daylight, the translucent elements therefore appear preferably white, especially milky white, or grey to an observer, wherein components arranged below the translucent elements are not or at best only dimly recognizable. In particular, the translucent elements can scatter light. For this purpose, the translucent elements can have structures on which light is scattered. Such structures may include or be particles in a matrix material and/or surface structures and/or particle or crystal boundaries surrounding the particles in a sintered or polycrystalline material.

According to a further embodiment, the first translucent element, as seen from the mounting surface, is arranged over the plurality of light-emitting diode chips, while the second translucent element is arranged on a side of the plurality of light-emitting diode chips opposite the first translucent element. The light-emitting diode chips are thus arranged between the first and second translucent elements, especially in a direction vertical to the mounting surface.

According to another embodiment, the light generated by the light-emitting diode chips during operation is emitted outwards into the environment by both translucent elements, i.e., the first and second translucent elements. During operation, the light-emitting device emits light through both translucent elements from the mounting surface at least upwards and downwards.

According to another embodiment, the light-emitting diode chips are enclosed by the first and second translucent elements, so that all light that reaches the environment from the light-emitting diode chips must traverse at least one of the translucent elements. Furthermore, the first translucent element may have a first surface remote from the light-emitting diode chips and the second translucent element may have a second surface remote from the light-emitting diode chips. The first and second surfaces can form interfaces of the light-emitting device to the environment. In other words, the translucent elements and in particular their surfaces facing away from the light-emitting diode chips form the outer sides of the light-emitting device.

According to another embodiment, the first translucent element has a diffusion layer or is formed by a diffusion layer, which can be formed, for example, as a casting over the light-emitting diode chips. Furthermore, the second translucent element can also have a scattering layer or be made of it. For example, the scattering layer of the second translucent element can be applied to a side of the carrier facing away from the light-emitting diode chips, e.g., as a casting compound. In this case, the carrier may preferably be transparent, for example, with or made from glass, plastic and/or sapphire. Instead of a casting process, a scattered layer can, for example, also contain or be made from a molded body produced in a molding process such as injection molding.

In particular, the scattering layer of the first and/or second translucent element(s) may comprise a transparent matrix material in which scattering particles are contained. In particular, the matrix material and the scattering particles are matched to each other in such a way that the scattering layer is as translucent as possible, i.e., as little as possible clearly transparent and as transmissive as possible for light. The transparent matrix material may for instance contain siloxanes, in particular silicones, epoxides, acrylates, methyl methacrylates, imides, carbonates, olefins, styrenes, urethanes or derivatives thereof in the form of monomers, oligomers or polymers, as well as mixtures, copolymers or compounds thereof. For example, the matrix material may have or be one or more materials selected from silicone resin, epoxy resin, polymethyl methacrylate (PMMA), polystyrene, polycarbonate, polyacrylate, polyurethane and compounds and mixtures thereof. The scattering particles may contain a metal oxide, such as titanium oxide or aluminum oxide, such as corundum, and/or glass particles. The scattering particles can have diameters or grain sizes of less than one micrometer up to an order of magnitude of 10 micrometers or even up to 100 micrometers. As an alternative or in addition to particles, the matrix material can also contain cavities, for example, formed by gas bubbles or air bubbles.

Furthermore, it may also be possible that the second translucent element is formed by the carrier. In this case, the carrier has or is made of a translucent material. For example, the carrier can be formed like a previously described scattering layer. Furthermore, the carrier may also, for example, contain or be made of a translucent polycrystalline ceramic, for example, with or made of aluminum oxide. In cases where the carrier forms the second translucent element, a side of the carrier remote from the light-emitting diode chips may form an outer side of the light-emitting device.

According to another example, a wavelength conversion element is arranged between each of the light-emitting diode chips and the first translucent element. This can mean that a common wavelength conversion element is arranged above the light-emitting diode chips, which extends over the plurality of light-emitting diode chips. Alternatively, the light-emitting device may also comprise a plurality of wavelength conversion elements, each of which is arranged over a respective light-emitting diode chip. In this case, wavelength conversion elements over adjacent light-emitting diode chips can be spatially separated from each other. Such an embodiment can be more cost effective than a continuous wavelength conversion element, since the required amount of wavelength conversion materials can be reduced. In particular, one or more wavelength conversion elements may be arranged such that light generated by the light-emitting diode chips is at least partially converted into light of a different wavelength so that a mixed light can be emitted by the light-emitting device during operation. In particular, the light-emitting diode chips and one or more wavelength conversion elements may be selected so that the light-emitting device can emit white light. For example, blue emitting light-emitting diode chips in combination with a wavelength conversion material in the one or in the plurality of wavelength conversion elements can be suitable for that purpose, wherein the wavelength conversion material converts at least part of the blue light generated by the light-emitting diode chips into yellow and/or orange and/or green and/or red light. For example, the one or more wavelength conversion elements may contain one or more of the following wavelength conversion materials: garnets of rare earths and alkaline earth metals, nitrides, nitridosilicates, siones, sialons, aluminates, oxides, halophosphates, orthosilicates, sulfides, vanadates and chlorosilicates. For example, one or more wavelength conversion materials can be selected from $Ce^{3+}$-doped garnets such as LuAG and YAG and/or from $Eu^{2+}$-doped red phosphors. Further, a wavelength conversion material may additionally or alternatively comprise an organic material which may be selected from a group comprising perylenes, benzopyrenes, coumarins, rhodamines and azo dyes. Further, the one or more wavelength conversion elements may comprise a transparent matrix material which surrounds or contains the wavelength conversion material(s) or which is chemically bonded to the wavelength conversion material(s). The transparent matrix material may comprise or be composed of one or more of the matrix materials described above in connection with the scattering layer. Alternatively, a suitable wavelength conversion material can also be applied directly to the light-emitting diode chips, for example, in the form of a scattered or sprayed powder or in the form of a ceramic plate.

According to another embodiment, a wavelength conversion layer is arranged on the mounting surface of the carrier between the carrier and the light-emitting diode chips. Such a wavelength conversion layer arranged below the light-emitting diode chips can be particularly advantageous if the light-emitting diode chips also emit light in the direction of the carrier during operation. In this case, the wavelength conversion layer is located between the light-emitting diode chips and the second translucent element. The wavelength conversion layer may contain materials and features as described above in connection with one or more of the wavelength conversion elements. Furthermore, the one or more wavelength conversion elements on the light-emitting diode chips and the wavelength conversion layer below the light-emitting diode chips may have compositions different from each other, so that in the switched-on state of the light-emitting device, for example, a slightly aesthetic color variation is possible. Alternatively, the one or more of the wavelength conversion elements on the light-emitting diode chips and the wavelength conversion layer below the light-emitting diode chips may have the same wavelength conversion materials.

The one or more wavelength conversion elements on the light-emitting diode chips and, if applicable, the wavelength conversion layer arranged below the light-emitting diode chips are each covered by the translucent elements when viewed from the outside, so that they are not directly visible from the outside. This may make it possible to attenuate or completely conceal the typical colored impression of wavelength conversion materials that prevails when the light-emitting device is switched off, since an external observer prefers to see only the translucent elements and their white or grey appearance. In contrast to other light sources containing phosphors, the light-emitting device may therefore appear white or grey and thus not or only slightly colored. When used as a filament in an incandescent-type light source, the light-emitting device may therefore appear more discreet, making such a light source more similar to classical incandescent lamps. In addition, light generated during operation can be emitted from all sides by internal scattering effects in the translucent elements, resulting in high efficiency. In addition, this can reduce glare to an observer while, at the same time, a uniform light emission can be achieved over the entire outer surface of the light-emitting device.

BRIEF DESCRIPTION OF THE DRAWINGS

Further advantages, advantageous embodiments and further developments are revealed by the embodiments described below in connection with the figures, in which.

Figure 1:
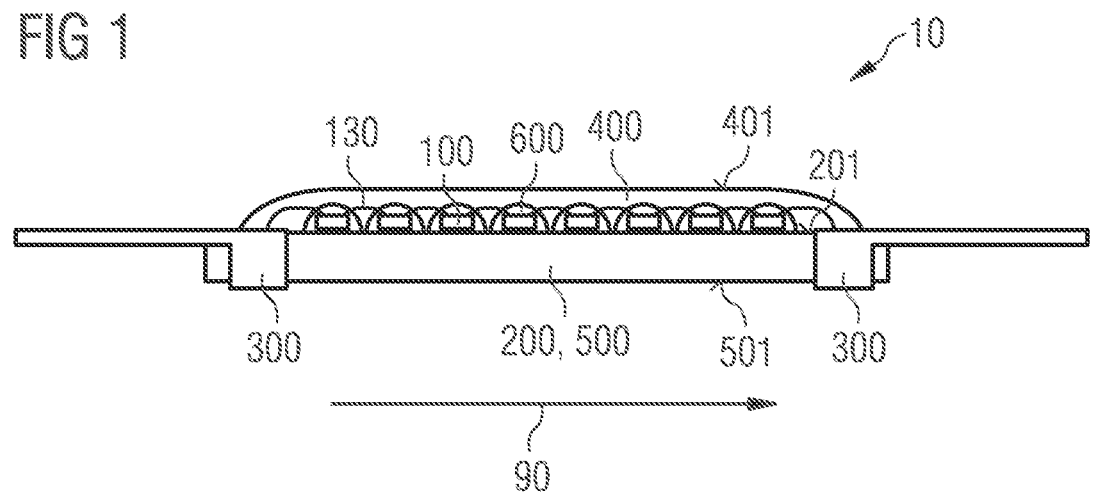
FIG. 1 shows a schematic illustration of a light-emitting device according to an embodiment.

In the embodiments and figures, identical, similar or identically acting elements are provided in each case with the same reference numerals. The elements illustrated and their size ratios to one another should not be regarded as being to scale, but rather individual elements, such as, for example, layers, components, devices and regions, may have been made exaggeratedly large to illustrate them better and/or to aid comprehension.

DETAILED DESCRIPTION OF ILLUSTRATIVE EMBODIMENTS

FIG. 1 shows an example of a light-emitting device 10 comprising a plurality of light-emitting diode chips 100 on a carrier 200. The carrier 200 has a mounting surface 201 onto which the light-emitting diode chips 100 are glued. The carrier 200 is elongated with a main extension direction along a longitudinal direction indicated by the arrow 90o in FIG. 1. Accordingly, the mounting surface 201 also has a larger dimension in the longitudinal direction 90o than in a lateral direction which is perpendicular thereto and protrudes from the image plane in the shown illustration. The light-emitting diode chips 100 are arranged along the longitudinal direction 90 on the mounting surface 201 and connected in series with each other by means of bond wires 130.

Furthermore, the light-emitting device 10 has electrical contact elements 300 at the two ends of the carrier 200 opposite each other in the longitudinal direction 90, which may be made of metal, for example, and which are intended and embodied for electrical contacting of the light-emitting device 10. In particular, the electrical contact elements 300 are connected via corresponding bonding wires to the first and the last light-emitting diode chip 100 of the series circuit described above, so that the light-emitting diode chip series circuit can be energized via the electrical contact elements 300.

The electrical contact elements 300 are also intended and embodied for the mechanical mounting of the light-emitting device 10 in an external fixture not shown here, which does not belong to the light-emitting device 10. The carrier by means of which the light-emitting device 10 can be fixed may, in particular, be part of a lighting device having the light-emitting device 10 as the light generating element. In particular, the fixture can also form an electrical supply line for the light-emitting device 10. For example, the lighting device may have a structure similar to an incandescent lamp using the light-emitting device 10 instead of a glow wire.

The light-emitting device 10 furthermore has a first translucent element 400 above the light-emitting diode chips 100. The carrier 200 forms a second translucent element 500 arranged on a side of the plurality of light-emitting diode chips 100 opposite the first translucent element 400 and thus below the light-emitting diode chips 100, so that the light-emitting diode chips 100 are arranged between the first and second translucent elements 400, 500. In particular, the light-emitting diode chips 100 can be enclosed by the first and second translucent elements 400, 500.

In the embodiment shown, the first translucent element 400 is formed in particular by a scattering layer described above in the general part, the scattering layer acting as a diffuser for light and appearing white, preferably milky white, or grey to an observer in daylight. For this purpose, the first translucent element comprises a matrix material, for example, a silicone or other material described above in the general part, in which scattering particles are contained, for example, with or of $TiO_2$ and/or $Al_2O_3$. The first translucent element 400 can be applied, for example, as a casting compound or as a molded body produced by a molding process.

The carrier 200, which forms the second translucent element 500 as described above, is made of a light-scattering dielectric material in the embodiment shown. In particular, the carrier 200 may comprise or consist of a translucent polycrystalline ceramic material, such as a polycrystalline aluminum ceramic ($Al_2O_3$). Such material can, for example, be less expensive than conventional carriers which are made of sapphire.

Furthermore, the light-emitting device 10 has a wavelength conversion element 600 above each of the light-emitting diode chips 100. The wavelength conversion elements 600 are thus arranged between the light-emitting diode chips 100 and the first translucent element 400. In particular, like the light-emitting diode chips 100 the wavelength conversion elements 600 are enclosed by the first translucent element 400 and by the carrier 200, which is formed as the second translucent element 500. Each of the wavelength conversion elements 600 contains one or more wavelength conversion materials capable of converting a portion of the light emitted by the operated light-emitting diode chips 100 into light of a different wavelength, so that the light-emitting device 10 can emit a desired mixed light during operation. For example, the light-emitting diode chips 100 may be embodied to emit blue light during operation, while the wavelength conversion elements 600 may be embodied to convert some of the blue light into longer wavelength light such as yellow and/or orange and/or green and/or red light. For this purpose, the wavelength conversion elements 600 may contain $Ce^{3+}$-doped garnets such as LuAG or YAG and/or $Eu^{2+}$-doped red phosphors or other phosphors mentioned above in the general part. The wavelength conversion elements 600 cover the light-emitting diode chips 100 on all five exposed sides, so that light conversion can be achieved on all sides apart from the mounting side facing the mounting surface 201. Furthermore, the wavelength conversion elements 600 are kept as thin as possible in order to be able to form the light-emitting device 10 as thin as possible.

Figure 2:
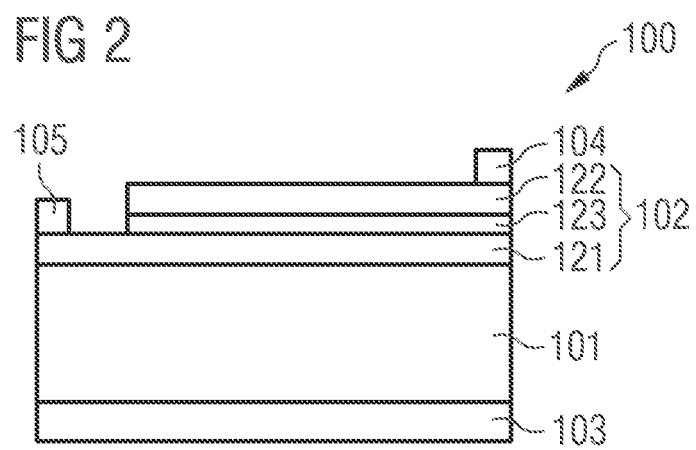
FIG. 2 shows a schematic illustration of a light-emitting diode chip for a light-emitting device according to another embodiment.

The light-emitting diode chips 100 are embodied in such a way that during operation they emit light directed away from the carrier 200 in the direction of the respective wavelength conversion element 600. An example of a corresponding light-emitting diode chip 100 is shown in FIG. 2, which has a semiconductor layer sequence 102 on a substrate 101. As an example, two semiconductor layers 121, 122 are shown, between which an active layer 123 is arranged, which is embodied and intended to generate light during operation of the light-emitting diode chip 100.

Depending on the desired wavelength of the emitted light, the semiconductor layer sequence 102 or at least the active layer 123 as described above in the general part can be based on $In_xGa_yAl_{1-x-y}As$, $In_xGa_yAl_{1-x-y}P$ or $In_xGa_yAl_{1-x-y}N$, where $0 \leq x \leq 1$, $0 \leq y \leq 1$ and $x+y \leq 1$ applies in each case. In order to produce blue light as described above in conjunction with FIG. 1, the semiconductor layer sequence 102 can be based in particular on the latter nitride compound semiconductor material system. Alternatively or additionally, the semiconductor layer sequence 102 or at least the active layer 123 may also be based on II-VI compound semiconductor material systems, such as ZnO, ZnMgO, CdS, ZnCdS, MgBeO and compounds and combinations thereof, instead of the III-V compound semiconductor material systems mentioned above.

The semiconductor layer sequence 102 can be epitaxially deposited on a growth substrate such as the substrate 101 shown. Alternatively, the semiconductor layer sequence 102 can also be transferred to a carrier substrate after the epitaxial growth. The substrate 101 may comprise or be a semiconductor material, such as a compound semiconductor material mentioned above, or any other suitable material. In particular, a growth substrate and/or carrier substrate may, for example, comprise or be of sapphire, GaAs, GaP, GaN, InP, SiC, Si and/or Ge.

The semiconductor layer sequence 102 can have a conventional pn junction, a double heterostructure, a single quantum well structure (SQW structure) or a multiple quantum well structure (MQW structure) as the active layer 123. The semiconductor layer sequence 102 may include, in addition to the active layer 123, further functional layers and functional areas which are indicated by the layers 121, 122, such as p- or n-doped charge carrier transport layers, i.e., electron or hole transport layers, undoped or p- or n-doped confinement, cladding or waveguide layers, as well as barrier layers, planarization layers, buffer layers and/or protective layers and combinations thereof. Moreover, additional layers such as buffer layers, barrier layers and/or protective layers can also be arranged perpendicular to the growth direction of the semiconductor layer sequence 102, for example, around the semiconductor layer sequence 102, i.e., on the side surfaces of the semiconductor layer sequence 102.

Furthermore, in the embodiment shown, a mirror layer 103 is arranged on a side of the substrate 101 facing away from the semiconductor layer sequence 102 and thus between the semiconductor layer sequence 102 and the carrier 200 shown in FIG. 1, wherein the substrate 101 in this case is particularly preferably transparent and, in the case of a semiconductor layer sequence 102 based on a nitride compound semiconductor material system, can be formed, for example, of sapphire. In particular, the substrate 101 may be the growth substrate on which the semiconductor layer sequence 102 has been grown. Light generated in the active layer 123 and emitted in the direction of the back side of the substrate 101 opposite the semiconductor layer sequence 102 is reflected by the mirror layer 103 and thus emitted from the light-emitting diode chip 100 from the active layer 123 substantially laterally or upwardly in the direction of the respective wavelength conversion element 600 in the light-emitting device 10 shown in FIG. 1. Such a light-emitting diode chip can also be described as a so-called volume emitter with a back-side mirror.

Electrical contacts 104, 105 in the form of electrode layers or electrode structures are provided for the electrical contacting of the semiconductor layer sequence 102 and thus for applying an electrical current to the active layer 123. The positions shown on the semiconductor layer sequence 102 are to be understood purely as examples.

Alternatively to the shown structure, other arrangements of the layers are also possible. In particular, the mirror layer 103, for example, can also be arranged between the substrate 101 and the semiconductor layer sequence 102. Such a light-emitting diode chip 100 can also be described as a so-called thin-film light-emitting diode chip, in which the semiconductor layer sequence 102 is transferred from a growth substrate to a suitable carrier substrate after having been grown, and in which the growth substrate is subsequently removed or at least thinned. As in the case of the arrangement shown in FIG. 2 with the mirror layer 103 on the underside of the substrate 101, a mirror arranged between the substrate and the semiconductor layer sequence can also be used such that the light-emitting diode chip 100 emits light essentially in the direction facing away from the carrier 200.

As can be seen in FIG. 1, the first and second translucent elements 400, 50o each have a surface 401, 501 facing away from the light-emitting diode chips 100, the surfaces forming boundary surfaces of the light-emitting device 10 to the environment and thus forming outer sides thereof. When looking at the light-emitting device 10 in a switched-off state, one can therefore see from one side the substrate 200 formed as the second translucent element 500 and from the other side the first translucent element 400, both of which are scattering white or grey, so that in particular the wavelength conversion elements 600, which may appear colored due to the contained wavelength conversion substances, are not or only hardly recognizable. When the light-emitting device 10 is switched on, the light of the light-emitting diode chips 100, in particular blue light in the embodiment shown as described above, is emitted towards above, i.e., turned away from the carrier 200. Part of the light from the light-emitting diode chips 100 passes through the wavelength conversion elements 600, while another part is converted into longer wavelength light by the wavelength conversion elements 600, so that white light preferably exits the wavelength conversion elements 600. Part of the white light is emitted outwards by the first translucent element 400 over the surface 401, while another part is scattered back in the first translucent element 400. After several scattering events in the first translucent element 400 and in the carrier 200 formed as the second translucent element 500, this light is also emitted to the outside via the surfaces 401 and 501.

Since there are only a few regions in the shown set-up of the light-emitting device 10 that can absorb light, most of the light generated is emitted to the outside, which allows a high efficiency to be achieved.

Figure 3:
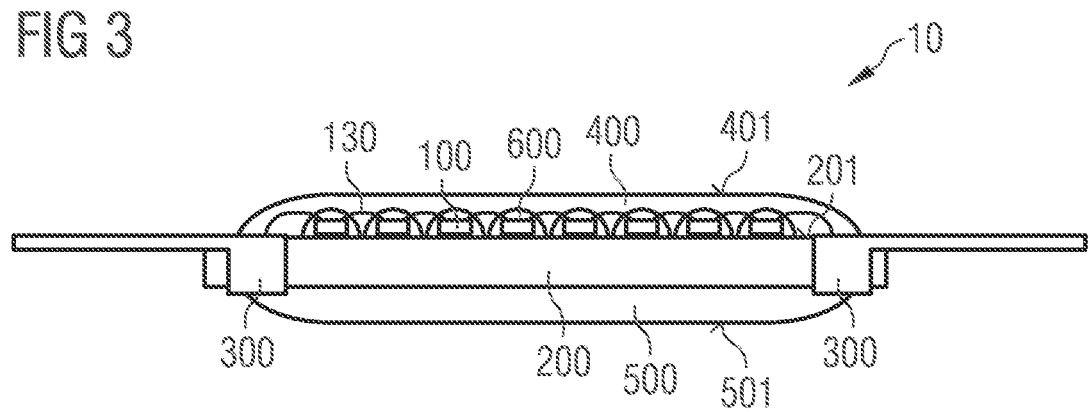
FIGS. 3 to 5 show schematic illustrations of light-emitting devices according to further embodiments.

FIG. 3 shows another embodiment of a light-emitting device 10 where the carrier 200 is transparent compared to the embodiment of FIG. 1. For example, the carrier 200 may have or be made of a transparent plastic and/or glass and/or sapphire. A second translucent element 500 is formed on the side of the carrier 200 facing away from the light-emitting diode chips 100, i.e., below the carrier 200 as seen from the light-emitting diode chips 100, wherein the second translucent element 500 can have or be made of a scattering layer as described above for the first translucent element 100. In particular, the first and second translucent elements 400, 500 enclose the light-emitting diode chips 100 and the wavelength conversion elements 600, so that the light-emitting device 10, as described in connection with FIG. 1, preferably appears white or grey in daylight from all sides in the switched-off state, while white light is emitted outwards from the surfaces 401, 501 in the switched-on state.

Figure 4:
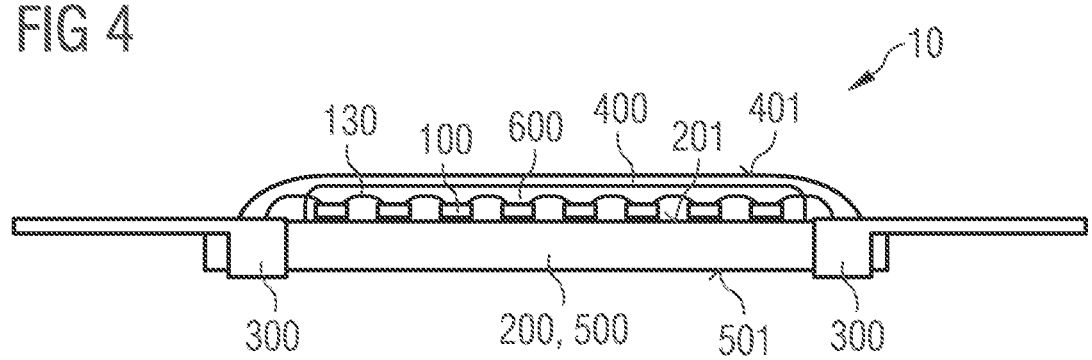

FIG. 4 shows another embodiment of a light-emitting device 10 which, compared to the embodiment of FIG. 1, has a single continuous wavelength conversion element 600 extending over the plurality of LED chips 100 instead of a plurality of spatially separated wavelength conversion elements 600. Such a coherent wavelength conversion element 600 can also be used instead of the spatially separated individual wavelength conversion elements 600 in all other embodiments shown above and below.

Figure 5:
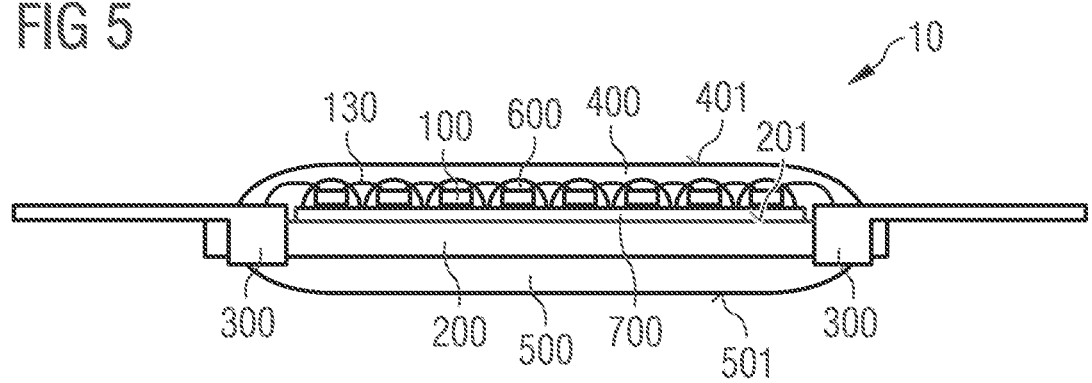
Figure 6:
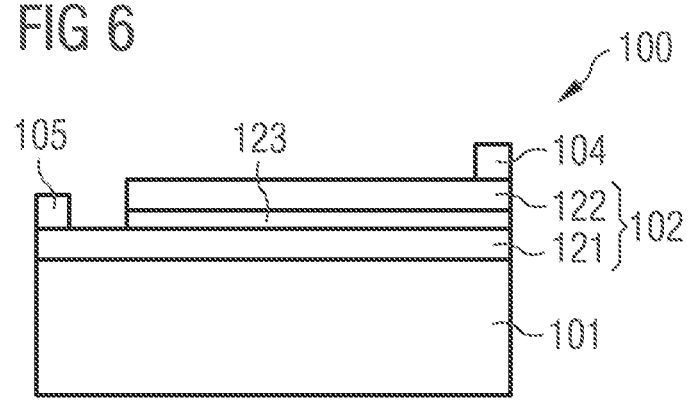
FIG. 6 shows a schematic illustration of a light-emitting diode chip for a light-emitting device according to another embodiment.

FIG. 5 shows another embodiment of a light-emitting device 10 which, compared to FIG. 3, has light-emitting diode chips 100 capable of emitting light in all directions instead of upwards emitting diode chips. FIG. 6 shows an embodiment of a corresponding light-emitting diode chip 100, which may be similar to the light-emitting diode chip 100 described in FIG. 2, but which has no mirror layer 103. This means that light can also be emitted through the transparent substrate 101, which can in particular be formed by a growth substrate. Such a light-emitting diode chip can also be cheaper than a light-emitting diode chip with a mirror layer.

In comparison to the previous examples, the light-emitting device 10 of FIG. 5 has an additional wavelength conversion layer 700 on the mounting surface 201 of the carrier 200 below the light-emitting diode chips 100, i.e., between the light-emitting diode chips 100 and the carrier 200. The wavelength conversion layer 700 can contain the same or different wavelength conversion materials compared to the wavelength conversion elements 600, so that the same or different mixed colors, for example, the same or different white shades, can be produced, whereby desired aesthetic color variations can be achieved. The wavelength conversion layer 700, for example, can contain a higher proportion of red phosphors than the wavelength conversion elements 600, so that, other than via the top side of the light-emitting device 10, i.e., via the first translucent element 400, rather warmer white light can be emitted via the rear side of the light-emitting device 10, i.e., via the second translucent element 500, so that a glowing impression can be created.

The wavelength conversion layer 700, on which the light-emitting diode chips 100 are bonded, can be applied, for example, by spraying particles of suitable wavelength conversion materials in a suitable matrix material such as a silicone or a polysilazane, by conventional fluorescent deposition or by a fluorescent in glass process. To enable subsequent wire bonding with bond wires 150 for electrical connection of light-emitting diode chips 100, it is advantageous if the wavelength conversion layer 700 is hard.

Instead of the second translucent element 500 shown in FIG. 5 on the side of the transparent carrier 200 facing away from the light-emitting diode chips 100, the carrier 200 may, as described in connection with FIG. 1, also be formed as the second translucent element 500.

The embodiments illustrated in the figures can also be combined with one another according to further embodiments, even if not all such combinations are explicitly shown. Furthermore, the embodiments described in connection with the figures may have additional and/or alternative features according to the description in the general part.

The invention is not limited by the description based on the embodiments to these embodiments. Rather, the invention includes each new feature and each combination of features, which includes in particular each combination of features in the patent claims, even if this feature or this combination itself is not explicitly explained in the patent claims or embodiments.

The invention claimed is:

1. A light-emitting device comprising:
light-emitting diode chips arranged on a mounting surface of a carrier;
a first translucent element; and
a second translucent element,
wherein the first translucent element is arranged over the light-emitting diode chips as viewed from the mounting surface and the second translucent element is disposed on a side of the light-emitting diode chips opposite the first translucent element, such that the light-emitting diode chips are arranged between the first and second translucent elements,
wherein the second translucent element comprises a diffusing layer disposed beneath the carrier as viewed from the light-emitting diode chips,
wherein the first and second translucent elements are configured to emit light generated by the light-emitting diode chips during operation outwardly,
wherein the first and second translucent elements appear white or grey in daylight when the light-emitting device is in a switched-off state,
wherein the first and second translucent elements have structures configured to scatter light, and
wherein the structures comprise particles in a matrix material and/or surface structures and/or particles or crystal boundaries surrounding the particles in a sintered or a polycrystalline material so that components arranged below the first and the second translucent element are not visible for a naked eye.

2. The light-emitting device according to claim 1, wherein the light-emitting diode chips are enclosed by the first and second translucent elements.

3. The light-emitting device according to claim 1, wherein the second translucent element comprises the carrier.

4. The light-emitting device according to claim 1, wherein the first translucent element comprises a diffusing layer.

5. The light-emitting device according to claim 1, wherein each of the first and second translucent elements has a surface facing away from the light-emitting diode chips, each surface forming an interface of the light-emitting device with an environment.

6. The light-emitting device according to claim 1, further comprising a wavelength conversion element disposed between each of the light-emitting diode chips and the first translucent element.

7. The light-emitting device according to claim 6, wherein the wavelength conversion element comprises a plurality of wavelength conversion elements, wherein each of the wavelength conversion elements is disposed on a respective light-emitting diode chip, and wherein the wavelength conversion elements over the respective adjacent light-emitting diode chips are spatially separated from each other.

8. The light-emitting device according to claim 1, wherein, on the mounting surface, a wavelength conversion layer is disposed between the carrier and the light-emitting diode chips.

9. The light-emitting device according to claim 8, further comprising a wavelength conversion element, and wherein the wavelength conversion element and the wavelength conversion layer have compositions different from each other.

10. The light-emitting device according to claim 1, wherein the light-emitting diode chips are configured to emit light in a direction facing away from the carrier.

11. The light-emitting device according to claim 10, wherein the light-emitting diode chips are configured to further emit light in a direction of the carrier.

12. The light-emitting device according to claim 1, wherein all light-emitting diode chips are arranged on the same side of the carrier.

13. The light-emitting device according to claim 1, wherein the carrier is embodied elongated along a longitudinal direction and all light-emitting diode chips are arranged along the longitudinal direction on the carrier.

14. The light-emitting device according to claim 1, wherein the carrier has electrical contact elements at two opposite ends in a longitudinal direction.

15. The light-emitting device according to claim 14, wherein the electrical contact elements are configured to mechanically mount the light-emitting device in a fixture.

16. The light-emitting device according to claim 14, wherein the light-emitting diode chips form a series circuit, wherein the light-emitting diode chips are electrically contactable by the electrical contact elements.

17. The light-emitting device according to claim 1, further comprising a wavelength conversion element disposed between each of the light-emitting diode chips and the first translucent element, wherein, on the mounting surface, a wavelength conversion layer is disposed between the carrier and the light-emitting diode chips.

18. The light-emitting device according to claim 1,
wherein the first and second translucent elements comprise scattering layers which comprise a transparent matrix material in which scattering particles are contained, and
wherein the scattering particles are selected from the group consisting of titanium oxide and aluminum oxide.

19. The light-emitting device according to claim 1, wherein the first and second translucent elements appear white in daylight when the light-emitting device is in the switched-off state.

* * * * *